United States Patent [19]
Stolfa et al.

[11] Patent Number: 5,965,912
[45] Date of Patent: Oct. 12, 1999

[54] VARIABLE CAPACITOR AND METHOD FOR FABRICATING THE SAME

[75] Inventors: David Lewis Stolfa, Phoenix, Ariz.; Kenneth D. Cornett, Coral Springs, Fla.

[73] Assignee: Motorola, Inc., Schaumburg, Ill.

[21] Appl. No.: 08/929,123

[22] Filed: Sep. 3, 1997

[51] Int. Cl.⁶ .......................... H01L 27/108; H01L 29/76; H01L 29/93
[52] U.S. Cl. .......................... 257/312; 257/313; 257/595; 257/596; 257/598
[58] Field of Search ................................ 257/277, 312, 257/313, 595, 596, 598, 310; 422/26

[56] References Cited
U.S. PATENT DOCUMENTS

| | | | |
|---|---|---|---|
| 5,173,835 | 12/1992 | Cornett et al. | 257/310 |
| 5,192,871 | 3/1993 | Bamakrishnan et al. | 257/595 |
| 5,405,579 | 4/1995 | Melzer et al. | 422/26 |

*Primary Examiner*—Steven H. Loke
*Attorney, Agent, or Firm*—Robert F. Hightower

[57] ABSTRACT

A voltage variable capacitor (10) fabricated on a semiconductor substrate (11) includes a gate structure (62) and a well (22) under the gate structure (62). A heavily doped buried layer (15) and a heavily doped contact region (31) in the semiconductor substrate (11) form a low resistance conduction path from the well (22) to a surface (17) of the semiconductor substrate (11). A multi-finger layout is used to construct the voltage variable capacitor (10). In operation, when a voltage applied across the voltage variable capacitor (10) changes, the width of depletion region in the well (22) changes, and the capacitance of the voltage variable capacitor (10) varies accordingly.

15 Claims, 2 Drawing Sheets

VARIABLE CAPACITOR AND METHOD FOR FABRICATING THE SAME

BACKGROUND OF THE INVENTION

The present invention relates, in general, to electronic devices and, more particularly, to variable capacitors.

A tuner comprised of an inductor (L) and a variable capacitor (C) is widely used to provide a variable resonant frequency. Conventionally, a voltage controlled tuner includes a varactor serving as the variable capacitor. A varactor is a reverse biased diode. As the voltage applied to the varactor varies, the depletion width of in the diode changes, and so do the capacitance of the varactor and the resonant frequency of the voltage controlled tuner.

However, the range of capacitance variation of a varactor is quite limited. For example, the capacitance of a varactor usually varies approximately by a factor of two over a voltage range of approximately four volts. In low voltage applications such as portable wireless communication, a capacitance variation by a factor of five over a voltage range of approximately one volt is often desirable. Further, the diode in a varactor conducts when forward biased, which presents a leakage problem for the varactor.

Accordingly, it would be advantageous to have a voltage variable capacitor and a method for fabricating the capacitor. It is desirable for the capacitor to have a high quality factor and a low leakage. It is also desirable for the capacitor to have a large capacitance variation range over a small voltage range. It is further desirable for the capacitor to be fabricated with other integrated circuit devices in a monolithic semiconductor chip. It would be of further advantage for the method to be compatible with existing semiconductor integrated circuit fabrication processes.

DETAILED DESCRIPTION OF THE DRAWINGS

Generally, the present invention provides a voltage variable capacitor and a method for fabricating the voltage variable capacitor. The voltage variable capacitor is Metal Oxide on Semiconductor (MOS) capacitor fabricated on a semiconductor substrate. A gate structure serves as a top plate of the capacitor, and a well under the gate structure serves as a bottom plate of the capacitor. When the gate structure includes a polycrystalline silicon layer, the voltage variable capacitor is referred to as a singly poly capacitor. A heavily doped buried layer and a heavily doped contact region of the same conductivity type as the well form a low resistance conduction path from the well to the surface of the semiconductor substrate. To further reduce the series resistance and increase the quality factor (Q) of the voltage variable capacitor, a multi-finger layout is preferably used to construct the voltage variable capacitor. In operation, when a voltage applied across the top and bottom plates changes, the width of depletion region in the well changes, and the capacitance of the voltage variable capacitor varies accordingly. Preferably, the voltage variable capacitor is fabricated with other semiconductor devices, e.g., field effect transistors, bipolar transistors, resistors, inductors, or the like, on an integrated circuit chip. Therefore, the voltage variable capacitor is also referred to as a monolithic voltage variable capacitor.

Figure 1:
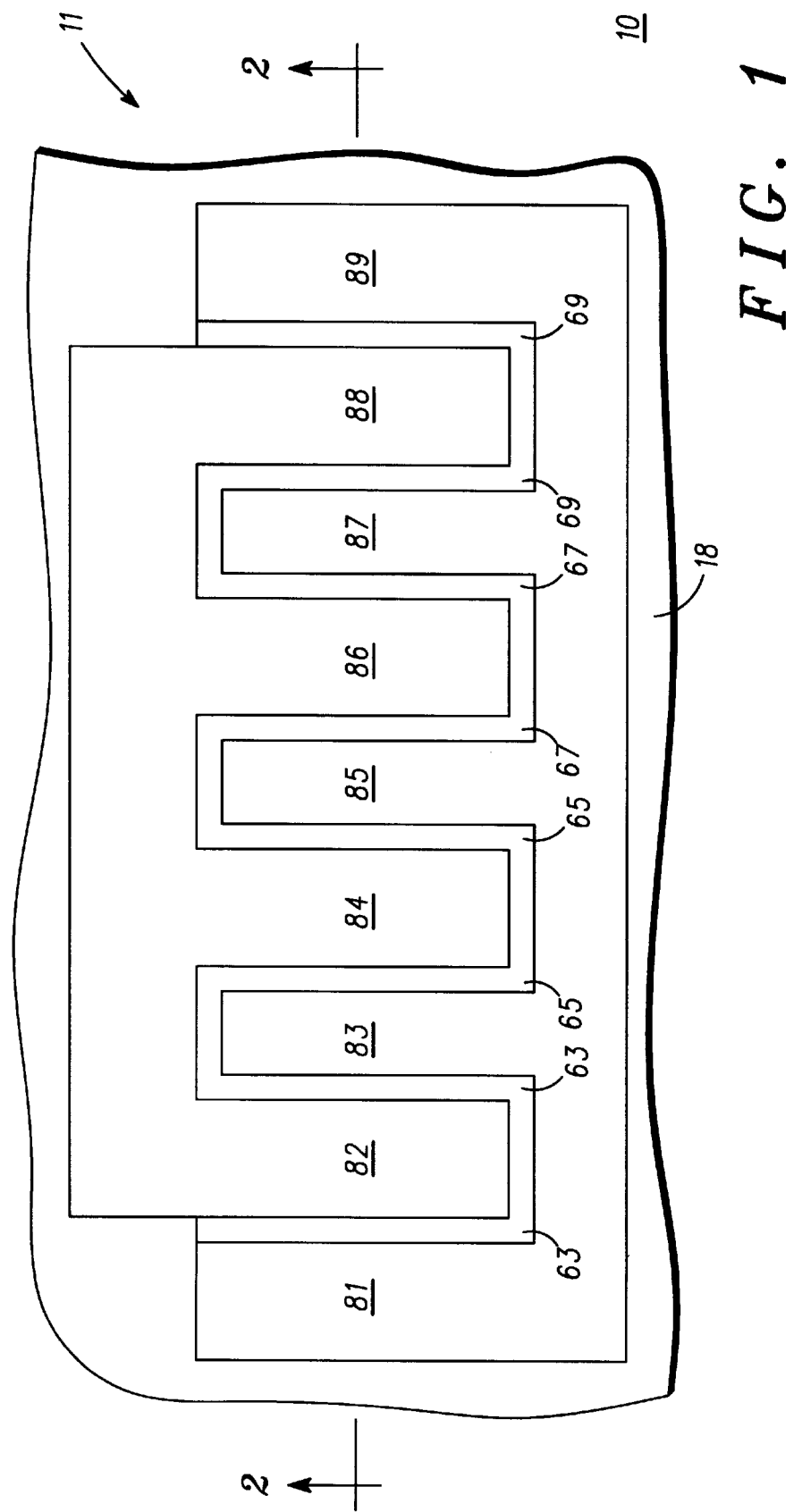
FIG. 1 is a schematic top view of a variable capacitor in accordance with the present invention.
Figure 2:
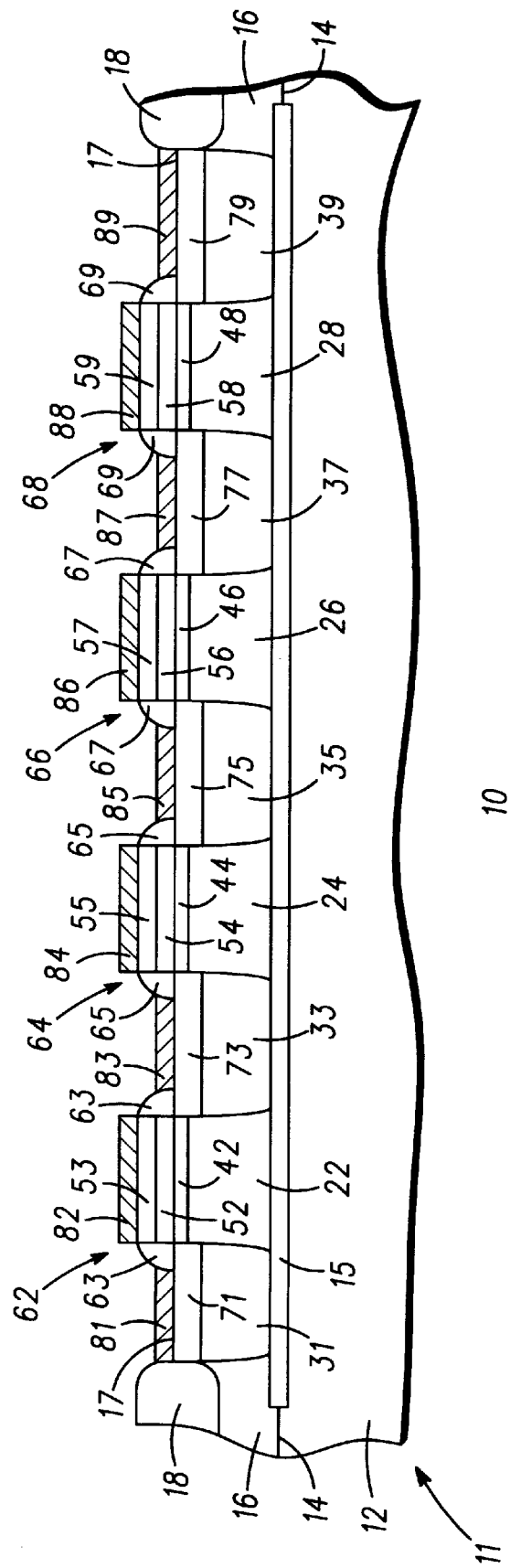
FIG. 2 is a schematic cross-sectional view of the variable capacitor of FIG. 1 along a section-line 2—2.

A voltage variable capacitor 10 in accordance with the present invention is schematically shown in FIGS. 1 and 2. More particularly FIG. 1 is a schematic top view of voltage variable capacitor 10, and FIG. 2 is a schematic cross-sectional view of voltage variable capacitor 10 along a section-line 2—2. It should be noted that the figures are not drawn to scale and that the same reference numerals are used in the figures to represent elements of similar structures and functions.

Voltage variable capacitor 10 is fabricated in a body 11 of semiconductor material. Body 11 of semiconductor material includes a semiconductor substrate 12. By way of example, semiconductor substrate 12 is a P conductivity type silicon substrate having a dopant concentration between approximately $1 \times 10^{15}$ atoms per cubic centimeter (atoms/cm$^3$) and approximately $1 \times 10^{17}$ atoms/cm$^3$. Ions of N conductivity type such as, for example, phosphorus ions or arsenic ions, are implanted into semiconductor substrate 12 adjacent its front surface 14. The implanted ions form a doped layer 15 in semiconductor substrate 12 adjacent to front surface 14. Doped layer 15 has a dopant concentration between, for example, approximately $1 \times 10^{19}$ atoms/cm$^3$ and approximately $5 \times 10^{22}$ atoms/cm$^3$. Body 11 of semiconductor material also includes a layer 16 of semiconductor material epitaxially grown on front surface 14 of semiconductor substrate 12. A major surface 17 of epitaxial layer 16 is also referred to as a major surface of body 11 of semiconductor material. Epitaxial layer 16 buries doped layer 15. Thus, doped layer 15 is also referred to as a buried layer. The thickness of epitaxial layer 16 is substantially equal to the depth of buried layer 15. By way of example, the depth of buried layer 15 ranges between approximately 500 nanometers (nm) and approximately 3,000 nm. It should be noted that body 11 of semiconductor material comprised of semiconductor substrate 12, buried layer 15, and epitaxial layer 16 can also be referred to as a semiconductor substrate or simply a substrate.

Field oxide regions 18 are formed over the portions of epitaxial layer 16 in a Local Oxidation of Silicon (LOCOS) process. Field oxide regions 18 provide isolation structures between voltage variable capacitor 10 and other devices (not shown) fabricated on substrate 11. An ion implantation is optionally performed before forming field oxide regions 18 to form heavily doped regions (not shown) under field oxide regions 18. The heavily doped regions (not shown) prevent inadvertent turning on of parasitic field effect transistors formed under field oxide regions 18. It should be understood that the isolation structures on substrate 11 can be formed using other processes such as, for example, poly-buffered LOCOS, poly-encapsulated LOCOS, trenching, etc.

Ions of N conductivity type such as, for example, phosphorus ions or arsenic ions are selectively implanted into epitaxial layer 16 to form N-conductivity type wells 22, 24, 26, and 28. Wells 22, 24, 26, and 28 extend from major surface 17 into epitaxial layer 16 and reach buried layer 15. The dopant concentration of wells 22, 24, 26, and 28 is between, for example, $1 \times 10^{15}$ atoms/cm$^3$ and $1 \times 10^{17}$ atoms/cm$^3$. Wells 22, 24, 26, and 28 serve as a bottom plate of capacitor 10. The process of implanting ions into epitaxial layer 16 typically includes forming a dielectric layer (not shown) over major surface 17, forming a photoresist mask (not shown) on the dielectric layer, implanting ions through the openings in the photoresist mask, stripping the photoresist mask, heating substrate 11 to drive the implanted ions into epitaxial layer 16. These steps are compatible with standard MOS and/or bipolar fabrication processes. For example, wells 22, 24, 26, and 28 can be formed in the same steps as those forming the channel region of a p-channel MOS Field Effect Transistor (MOSFET) (not shown) and/or forming the collector region of an NPN bipolar transistor (not shown). It should be noted that wells 22, 24, 26, and 28 can be formed either before or after the formation of field oxide regions 18.

Contact regions 31, 33, 35, 37, and 39 of N conductivity type are formed in epitaxial layer 16 adjacent corresponding wells 22, 24, 26, and 28 and extending from major surface 17 to buried layer 15. The dopant concentration of contact regions 31, 33, 35, 37, and 39 are preferably higher than that of wells 22, 24, 26, and 28. By way of example, the dopant concentration of contact regions 31, 33, 35, 37, and 39 is between $1 \times 10^{16}$ atoms/cm$^3$ and $1 \times 10^{21}$ atoms/cm$^3$. Contact regions 31, 33, 35, 37, and 39 provide low resistance conductive paths from buried layer 15 to major surface 17, and they are also referred to as sinkers or plugs. As shown in FIG. 2, contact regions 31 and 33 sandwich well 22, contact regions 33 and 35 sandwich well 24, contact regions 35 and 37 sandwich well 26, and contact regions 37 and 39 sandwich well 28. In other words, well 22 separates contact region 31 from contact region 33, well 24 separates contact region 33 from contact region 35, well 26 separates contact region 35 from contact region 37, and well 28 separates contact region 37 from contact region 39. In accordance with an embodiment of the present invention, a well, e.g., well 22, separates a pair of corresponding contact regions, e.g., contact regions 31 and 33, from each other by a length greater than the depth of buried layer 15. In this embodiment, the lowest resistance conduction path from the bottom plate of capacitor 10 to major surface 17 of epitaxial layer 16 is through a corresponding well, e.g., well 22, buried layer 15, and corresponding contact regions, e.g., contact regions 31 and 33.

Surface regions 42, 44, 46, and 48 are formed in wells 22, 24, 26, and 28, respectively, adjacent to major surface 17. In one embodiment, surface regions 42, 44, 46, and 48 are formed by implanting ions of N conductivity type into corresponding wells 22, 24, 26, and 28. Thus, the dopant concentration of surface regions 42, 44, 46, and 48 is higher than that of wells 22, 24, 26, and 28. The higher dopant concentration in surface regions 42, 44, 46, and 48 serves to reduce the series resistance and increase the Q of capacitor 10. In an alternative embodiment, surface regions 42, 44, 46, and 48 are formed by implanting ions of P conductivity type into corresponding wells 22, 24, 26, and 28. Thus, the dopant concentration of surface regions 42, 44, 46, and 48 is lower than that of wells 22, 24, 26, and 28. The lower dopant concentration in surface regions 42, 44, 46, and 48 serves to decrease the minimum capacitance of capacitor 10. Therefore, the range of capacitance variation of capacitor 10 is increased. The dopant concentration in surface regions 42, 44, 46, and 48 also affects the required voltages applied to capacitor 10 to achieve the minimum and maximum capacitance values. The process of forming surface regions 42, 44, 46, and 48 is compatible with standard MOS and/or bipolar fabrication process. For example, surface regions 42, 44, 46, and 48 can be formed in the same steps as those for forming the threshold voltage adjusting regions in a MOSFET (not shown). It should be understood that surface regions 42, 44, 46, and 48 are optional in capacitor 10.

A dielectric layer, e.g., a silicon dioxide layer having a thickness between approximately 5 nm and approximately 30 nm, is disposed over major surface 17. A conductive layer, e.g., a polycrystalline silicon layer having a thickness between approximately 100 nm and approximately 600 nm, is deposited on the dielectric layer. The conductive layer and the dielectric layer are then patterned to form gate structures overlying wells 22, 24, 26, and 28. FIG. 2 shows gate dielectric layers 52, 54, 56, and 58 overlying wells 22, 24, 26, and 28, respectively, and conductive regions 53, 55, 57, and 59 on gate dielectric layers 52, 54, 56, and 58, respectively. In other words, conductive region 53 and gate dielectric layer 52 form a gate structure 62 overlying well 22, conductive region 55 and gate dielectric layer 54 form a gate structure 64 overlying well 24, conductive region 57 and gate dielectric layer 56 form a gate structure 66 overlying well 26, and conductive region 59 and gate dielectric layer 58 form a gate structure 68 overlying well 28. The thickness of gate dielectric layers 52, 54, 56, and 58 determines the maximum capacitance of capacitor 10. Conductive regions 53, 55, 57, and 59 function as four fingers of multi-finger structured capacitor 10. They are connected together, serving as a top plate of capacitor 10. Preferably, conductive regions 53, 55, 57, and 59 are doped to reduce the series resistance and increase the Q of capacitor 10. Whether conductive regions 53, 55, 57, and 59 are doped with ions of P conductivity type or ions of N conductivity type will affect the voltage range at which capacitor 10 operates. The steps of forming the dielectric layer, the conductive layer, and gate structures 62, 64, 66, and 68 can be performed in the same steps as those forming the gate structure of a MOSFET (not shown).

An insulating layer such as, for example, a silicon nitride layer is deposited over gate structures 62, 64, 66, and 68, and over substrate 11. The insulating layer is patterned to form spacers 63 adjacent gate structure 62, spacers 65 adjacent gate structure 64, spacers 67 adjacent gate structure 66, and spacers 69 adjacent gate structure 68. Techniques for forming spacers adjacent gate structures are well know to those skilled in the art.

Ions of N conductivity type such as, for example, phosphorous ions or arsenic ions are implanted into epitaxial layer 16 to formed doped regions 71, 73, 75, 77, and 79 in corresponding contact regions 31, 33, 35, 37, and 39 adjacent major surface 17. The dopant concentration of doped regions 71, 73, 75, 77, and 79 are thus higher than that of portions of contact regions 31, 33, 35, 37, and 39 below corresponding doped regions 71, 73, 75, 77, and 79. By way of example, the dopant concentration of doped regions 71, 73, 75, 77, and 79 is between $1 \times 10^{18}$ atoms/cm$^3$ and $1 \times 10^{22}$ atoms/cm$^3$. Doped regions 71, 73, 75, 77, and 79 provide low resistance contacts to corresponding contact regions 31, 33, 35, 37, and 39. Doped regions 71, 73, 75, 77, and 79 can be formed in the same steps as those forming the source and drain regions of an n-channel MOSFET (not shown) and/or forming the emitter region of an NPN bipolar transistor (not shown). It should be understood that doped regions 71, 73, 75, 77, and 79 are optional in capacitor 10.

A silicide structure, e.g., a titanium silicide structure, is formed over epitaxial layer 16. The silicide structure includes silicide regions 81, 83, 85, 87, and 89 overlying and electrically coupled to contact regions 31, 33, 35, 37, and 39, respectively, and silicide regions 82, 84, 86, and 88 overlying and electrically coupled to gate structures 62, 64, 66, and 68, respectively. Silicide regions 81, 82, 83, 84, 85, 86, 87, 88, and 89 are aligned with spacers 63, 65, 67, and 69. Thus, they are also referred to as self aligned silicide (salicide) regions. Silicide regions 82, 84, 86, and 88 are connected together, forming a conductive structure and serving as a first electrode of capacitor 10. Silicide regions 81, 83, 85, 87, and 89 are connected together, forming another conductive structure and serving as a second electrode of capacitor 10. It should be understood that the electrodes of capacitor 10 are not limited to being formed from titanium silicide structures. They can be formed from other types of conductive structures such as, for example, tungsten silicide, molybdenum silicide, cobalt silicide structures, or the like. Further, silicide regions 81, 82, 83, 84, 85, 86, 87, 88, and 89 are optional in capacitor 10.

Subsequently, an oxide layer (not shown) is formed over substrate 11 and serving as an InterLayer Dielectric (ILD). Using techniques well known in the art, metallization regions (not shown) are formed in the ILD to lead the electrodes of capacitor 10 to the upper surface of ILD and/or to other devices (not shown) fabricated on substrate 11. In one embodiment, one metallization region is connected to silicide regions 82, 84, 86, and 88, serving as the first electrode of capacitor 10, and another metallization region is connected to silicide regions 81, 83, 85, 87, and 89, serving as the second electrode of capacitor 10. In an alternative embodiment in which capacitor 10 does not include silicide regions 81, 82, 83, 84, 85, 86, 87, 88, and 89, the metallization serving as the first electrode of capacitor 10 is in direct contact with conductive regions 53, 55, 57, and 59, and the metallization region serving as the second electrode of capacitor 10 is in direct contact with contact regions 31, 33, 35, 37, and 39.

It should be understood that the structure of capacitor 10 is not limited to being that shown in FIGS. 1 and 2 and described hereinbefore. For example, capacitor 10 is not limited to having a four-finger structure as shown in FIGS. 1 and 2. Capacitor 10 can have any number of fingers, e.g., two, three, five, six, etc. Capacitor 10 can also include a plurality of multi-finger elements coupled together. Each multi-finger element has a structure similar to that described hereinbefore and shown in FIGS. 1 and 2. Silicide regions 81, 83, 85, 87, and 89 overlying corresponding contact regions 31, 33, 35, 37, and 39 are not limited to being connected to each other as shown in FIG. 1. They can be electrically coupled to each other via metallization regions (not shown) formed in the ILD (not shown). Likewise, silicide regions 82, 84, 86, and 88 overlying corresponding gate structures 62, 64, 66, and 68 are not limited to being connected to each other as shown in FIG. 1. They can be electrically coupled to each other via metallization regions (not shown) formed in the ILD (not shown). Further, capacitor 10 is not limited to having N conductivity type buried layer 15, N conductivity type wells 22, 24, 26, and 28, and N conductivity type contact regions 31, 33, 35, 37, and 39. In an alternative embodiment of the present invention, buried layer 15, wells 22, 24, 26, and 28, and contact regions 31, 33, 35, 37, and 39 are of P conductivity type.

In operation, the capacitance of capacitor 10 is controlled by adjusting the voltage applied across gate structures 62, 64, 66, and 68 and contact regions 31, 33, 35, 37, and 39. Over a voltage range of approximately one volt, the capacitance of capacitor 10 can vary approximately by a factor of five. The Q of capacitor 10 can reach approximately 15 or higher when capacitor 10 is operated at a frequency of approximately one giga-Hertz. In addition, because gate structures 62, 64, 66, and 68 are MOS gate structures, capacitor 10 has a very low leakage.

By now it should be appreciated that a voltage variable capacitor and a method for fabricating the voltage variable capacitor have been provided. Compared with a varactor, the voltage variable capacitor of the present invention has a high Q and a low leakage. The voltage variable capacitor also has a large capacitance variation range over a small voltage range. The voltage variable capacitor can be fabricated with other integrated circuit devices in a monolithic semiconductor chip. Further, the method for fabricating the voltage variable capacitor is compatible with existing semiconductor integrated circuit fabrication processes. Therefore, the voltage variable capacitor of the present invention is cost efficient and suitable for use in low voltage applications such as, for example, portable wireless communication applications.

We claim:

1. A variable capacitor, comprising:
    a semiconductor substrate having a major surface;
    a plurality of wells of a first conductivity type and a first dopant concentration in said semiconductor substrate;
    a plurality of contact regions of the first conductivity type and a second dopant concentration in said semiconductor substrate, the second dopant concentration being higher than the first dopant concentration, and a first contact region and a second contact region of said plurality of contact regions sandwiching a first well of said plurality of wells;
    a buried layer of the first conductivity type and a third dopant concentration in said semiconductor substrate and underlying said plurality of wells and said plurality of contact regions, the third dopant concentration being higher than the first dopant concentration; and
    a plurality of gate structures over the major surface of said semiconductor substrate and overlying said plurality of wells.

2. The variable capacitor of claim 1, further comprising:
    a first conductive structure coupled to said plurality of gate structures; and
    a second conductive structure coupled to said plurality of contact regions and electrically insulated from said first conductive structure.

3. The variable capacitor of claim 1, wherein said first well between said first contact region and said second contact region has a length and a depth, the depth being less than the length.

4. The variable capacitor of claim 1, further comprising a plurality of surface regions of the first conductivity type and a fourth dopant concentration in said plurality of wells adjacent the major surface of said semiconductor substrate, the fourth dopant concentration being lower than the first dopant concentration.

5. The variable capacitor of claim 1, further comprising a plurality of doped regions of the first conductivity type and a fourth dopant concentration in said plurality of contact regions adjacent the major surface of said semiconductor substrate, the fourth dopant concentration being higher than the first dopant concentration.

6. The variable capacitor of claim 1, wherein said plurality of gate structures include:
    a dielectric layer over the major surface of said semiconductor substrate and overlying said plurality of wells; and
    a polycrystalline silicon layer over said dielectric layer.

7. The variable capacitor of claim 6, wherein said polycrystalline silicon layer is doped with a dopant of a second conductivity type.

8. A variable capacitor, comprising:
    a body of semiconductor material having a major surface;
    a buried layer in said body of semiconductor material and at a depth from the major surface of said body of semiconductor material, said buried layer having a first conductivity type and a first dopant concentration;
    a plurality of wells extending from the major surface into said body of semiconductor material to the depth, said plurality of wells having the first conductivity type and a second dopant concentration lower than the first dopant concentration;

a plurality of sinkers adjacent said plurality of wells and extending from the major surface into said body of semiconductor material to the depth, said plurality of sinkers having the first conductivity type and a third dopant concentration higher than the second dopant concentration;

a dielectric layer over said body of semiconductor material and overlying said plurality of wells; and a plurality of conductive regions over said dielectric layer.

9. The variable capacitor of claim 8, further comprising:

a first conductive structure over said plurality of conductive regions and coupled to said plurality of conductive regions; and a second conductive structure over said plurality of sinkers, coupled to said plurality of sinkers, and electrically insulated from said first conductive structure.

10. The variable capacitor of claim 8, wherein a well of said plurality of wells separates a first sinker of said plurality of sinkers from a second sinker of said plurality of sinkers by a length, the length being greater than the depth.

11. The variable capacitor of claim 8, further comprising a plurality of surface regions in said plurality of wells adjacent the major surface of said body of semiconductor material, said plurality of surface regions having the first conductivity type and a fourth dopant concentration lower than the second dopant concentration.

12. The variable capacitor of claim 8, further comprising a plurality of doped regions in said plurality of sinkers adjacent the major surface of said body of semiconductor material, said plurality of doped regions having the first conductivity type and a fourth dopant concentration higher than the second dopant concentration.

13. The variable capacitor of claim 8, wherein:

said body of semiconductor material includes a silicon substrate; and said plurality of conductive regions are formed from a polycrystalline silicon layer.

14. The variable capacitor of claim 13, wherein said polycrystalline silicon layer is doped with a dopant of a second conductivity type opposite to the first conductivity type.

15. The variable capacitor of claim 13, wherein said polycrystalline silicon layer is doped with a dopant of the first conductivity type.

* * * * *